US011068155B1

United States Patent
Dalmia et al.

(10) Patent No.: US 11,068,155 B1
(45) Date of Patent: Jul. 20, 2021

(54) USER INTERFACE TOOL FOR A TOUCHSCREEN DEVICE

(71) Applicant: Dassault Systemes SolidWorks Corporation, Waltham, MA (US)

(72) Inventors: Priya Dalmia, Lexington, MA (US); Chinloo Lama, Bolton, MA (US); Kevin F. Berni, Lowell, MA (US)

(73) Assignee: DASSAULT SYSTEMES SOLIDWORKS CORPORATION, Waltham, MA (US)

( * ) Notice: Subject to any disclaimer, the term of this patent is extended or adjusted under 35 U.S.C. 154(b) by 0 days.

(21) Appl. No.: 15/853,412

(22) Filed: Dec. 22, 2017

Related U.S. Application Data

(60) Provisional application No. 62/440,822, filed on Dec. 30, 2016.

(51) Int. Cl.
*G06F 3/048* (2013.01)
*G06F 3/0488* (2013.01)
*G06F 3/0484* (2013.01)
*G06F 3/0481* (2013.01)

(52) U.S. Cl.
CPC ...... *G06F 3/04883* (2013.01); *G06F 3/04817* (2013.01); *G06F 3/04845* (2013.01); *G06F 3/04847* (2013.01); *G06F 2203/04805* (2013.01)

(58) Field of Classification Search
CPC ...... G06F 3/041; G06F 3/0481; G06F 3/0484; G06F 3/0488; G06F 3/01; G06F 3/04883; G06F 3/04817; G06F 3/04845; G06F 3/04847; G06F 2203/04805
See application file for complete search history.

(56) References Cited

U.S. PATENT DOCUMENTS

| | | | |
|---|---|---|---|
| 6,567,102 B2 | 5/2003 | Kung | |
| 8,136,052 B2 | 3/2012 | Shin | |
| 9,026,939 B2* | 5/2015 | Smus | G06F 3/0412 715/800 |
| 9,465,457 B2* | 10/2016 | Thompson | G06F 3/04883 |
| 9,715,864 B2* | 7/2017 | Mazzola | G06F 3/041 |
| 2006/0244735 A1* | 11/2006 | Wilson | G06F 3/0488 345/173 |
| 2008/0204476 A1* | 8/2008 | Montague | G06F 3/04845 345/661 |

(Continued)

OTHER PUBLICATIONS

Mings, J., "Onshape Snags Patent for Their Precision Touch Selection Shenanigans" https://www.solidsmack.com/cad/onshape-new-proximity-precision-touch-patent/ [Retrieved on Dec. 20, 2017].

(Continued)

*Primary Examiner* — Rashawn N Tillery
(74) *Attorney, Agent, or Firm* — Hamilton, Brook, Smith & Reynolds, P.C.

(57) ABSTRACT

A computer-implemented method and system for implementing a user interface (UI) tool for a touchscreen computer device displays a UI tool on a display of the touchscreen computer device. The UI tool is initially offset from a position of an object touching the surface of the display. The user controls the UI tool using the object. A command is executed, which operates on an entity indicated by the UI tool.

20 Claims, 8 Drawing Sheets
(6 of 8 Drawing Sheet(s) Filed in Color)

(56) References Cited

U.S. PATENT DOCUMENTS

| | | | |
|---|---|---|---|
| 2009/0083666 A1* | 3/2009 | Fitzmaurice | G06F 3/04815 715/834 |
| 2010/0009746 A1 | 1/2010 | Raymond et al. | |
| 2011/0093812 A1 | 4/2011 | Fong | |
| 2012/0326994 A1* | 12/2012 | Miyazawa | G06F 3/0488 345/173 |
| 2013/0019174 A1* | 1/2013 | Gil | G06F 3/04812 715/711 |
| 2013/0145287 A1 | 6/2013 | Jung et al. | |
| 2013/0174033 A1 | 7/2013 | Hanukaev | |
| 2013/0176245 A1* | 7/2013 | Kwon | G06F 3/0488 345/173 |
| 2013/0246970 A1 | 9/2013 | Helle | |
| 2013/0268883 A1 | 10/2013 | Kim | |
| 2013/0293496 A1 | 11/2013 | Takamoto | |
| 2013/0332892 A1 | 12/2013 | Matsuki | |
| 2014/0078102 A1* | 3/2014 | Araki | G06F 3/016 345/174 |
| 2014/0125657 A1* | 5/2014 | Murali | G06F 17/5004 345/419 |
| 2014/0313130 A1* | 10/2014 | Yamano | G06F 3/0488 345/157 |
| 2014/0372923 A1 | 12/2014 | Rossi | |
| 2016/0274686 A1 | 9/2016 | Alonso Ruiz | |
| 2016/0357281 A1 | 12/2016 | Fleizach | |
| 2017/0083229 A1* | 3/2017 | Luo | G06F 3/0236 |
| 2017/0220241 A1* | 8/2017 | Vangapalli | G06F 3/0482 |
| 2017/0255263 A1* | 9/2017 | Letendre | G06F 3/016 |
| 2017/0336966 A1 | 11/2017 | Morton et al. | |

OTHER PUBLICATIONS

Non-Final Office Action, U.S. Appl. No. 15/853,461, entitled, "Triggering Multiple Actions From a Single Gesture," dated May 15, 2019.

Final Office Action, U.S. Appl. No. 15/853,461, entitled "Triggering Multiple Actions From a Single Gesture", dated Sep. 11, 2019.

Non-Final Office Action, U.S. Appl. No. 15/853,461, entitled "Triggering Multiple Actions From a Single Gesture" dated Dec. 19, 2019.

Final Office Action, U.S. Appl. No. 15/853,461, entitled "Triggering Multiple Actions From a Single Gesture" dated Apr. 15, 2020.

Final Office Action for U.S. Appl. No. 15/853,461, titled "Triggering Multiple Actions From a Single Gesture", dated Jan. 29, 2021.

Non-Final Office Action for U.S. Appl. No. 15/853,461, titled, "Triggering Multiple Actions From a Single Gesture," dated May 12, 2021.

Non-Final Office Action for U.S. Appl. No. 15/853,461, titled, "Triggering Multiple Actions From a Single Gesture," dated Aug. 5, 2020.

* cited by examiner

102

104

106

402

USER INTERFACE TOOL FOR A TOUCHSCREEN DEVICE

RELATED APPLICATION

This application claims the benefit of U.S. Provisional Application No. 62/440,822, filed on Dec. 30, 2016. The entire teachings of the above application are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to topological faces bounded by edges. Hereinafter, the terms vertex, edge, and face will be used interchangeably with their respective, corresponding geometric entities.

A design engineer is a typical user of a 3D CAD system. The design engineer designs physical and aesthetic aspects of 3D models, and is skilled in 3D modeling techniques. The design engineer creates parts and may assemble the parts into a subassembly or an assembly. A subassembly may also consist of other subassemblies. An assembly is designed using parts and subassemblies. Parts and subassemblies are hereinafter collectively referred to as components.

Touch-enabled computer hardware devices are enhancing the tools used by the professional and commercial CAD industry. In order for a company to accommodate customers and support touchscreen hardware devices on which a user may choose to execute a software application or service, software applications (not only CAD applications) need to adapt and provide finger-friendly support for touch-enabled screens. Currently, a large number of client applications exist that are designed to work primarily with mouse and keyboard interactions. To ensure an uninterrupted experience with the same software being used on touchscreen and non-touchscreen devices, software commands and features need to be accessible via touch (e.g., fingertip and stylus) alone.

One-finger interaction is the primary touch interaction that a user has when working with a touchscreen. Therefore, assigning often-used interactions that a three-button mouse can support may cause multiple conflicts in practice. An example of the many commands that may be executed by pressing one finger on a mouse device are (a) left button event indicates that a selected object may be dragged, (b) middle button or dial event indicates that a selected object may be rotated, (c) right button event indicates that a menu should be displayed, and (d) a combination of a button and cursor motion may indicate an area should be magnified.

In addition to mapping mouse interactions to touch interactions, consideration must be given to the size of hit areas of an object. A fingertip is typically much larger than a cursor. Thus, designing user interface interactions for touch must also accommodate for the larger, less precise contact areas of touch technology.

Furthermore, some touch systems magnify an object by zooming in on the object then zooming back out after a selection is made (e.g., after a feature or component of a 3D model is selected). However, when magnifying an object, part of the object may be hidden by the user's finger, which is a further drawback of the current state of the art. This is particularly awkward when a user is attempting to drag a magnifier tool to a particular point, an action that needs accuracy. Additionally, prior art that shows the magnified area in a bubble above the touch point of the fingertip or stylus loses the visual context of the magnified area and the magnified area is not directly related to the area that is not magnified around the fingertip or stylus.

A system and method that enables touch-friendly interactions for enabling legacy applications to be interactive via touch devices while addressing the foregoing problems would be a beneficial improvement over current state-of-the-art CAD systems.

SUMMARY OF THE INVENTION

In general, in one aspect, embodiments of the present invention feature computer-implemented methods for displaying a user interface (UI) tool on a display of the touchscreen computer device. The UI tool is initially offset from a position of an object touching the surface of the display. The user controls the UI tool using the object and a command is executed by the touchscreen computer device, the command operating on an entity indicated by the UI tool.

Further embodiments feature a non-transitory computer-readable data storage medium comprising instructions causing a computer to display a UI tool on a touchscreen computer system, initially offset the UI tool from a position of an object touching a display surface of the touchscreen computer system, manipulate the UI tool from the position of the touching object, and perform an operation on an entity indicated by the UI tool.

Yet another embodiment is a computer system that executes instructions to configure the computer system processor to display a user interface tool on a touchscreen computer system, initially offset the user interface tool from a position of an object touching a display surface of the touchscreen computer system, manipulate the user interface tool from the position of the touching object, and perform an operation on an entity indicated by the user interface tool.

Further embodiments include invoking the UI tool upon detecting the user having difficulty selecting or locating an entity. The UI tool may also be invoked as one of a plurality of commands to invoke, determined by timing a duration prior to the touch object commencing a dragging motion.

Moreover, the UI tool contains an area that enables a user to focus on one or more entities displayed on the touchscreen computer device and the command modifies a display state within the area to change an appearance of the entity. In further aspects of the present invention, the area surrounds one or more entities, which the UI tool magnifies the one or more entities. When a target of the UI tool hovers over an entity displayed on the display that entity is highlighted.

Additionally, the initial offset for the UI tool is to the right of the touch object or to the left of the UI tool depending on whether the user is left- or righted-handed, respectively. Yet another aspect of the present invention is that moving the touch object along the perimeter of the UI tool causing one of a real and an illusory change of direction of motion of the user interface tool.

The UI tool is used to enclose entities displayed on a touchscreen computer system and to magnify the entities. Additionally the UI is used to perform a highlight and a select operation

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same objects throughout the different views. The drawings are not necessarily to scale, emphasis instead being placed upon illustrating embodiments of the present invention.

DETAILED DESCRIPTION OF THE INVENTION

The present invention applies to touch sensitive computer systems, and the use of a stylus or a user's fingertip to initiate a command to the computer system. The present invention allows a user to trigger multiple actions from a one-finger hold gesture and specific actions depending on the timing of one-finger touch interaction. The present invention enables users to contextually zoom into a three-dimensional (3D) model and make precise selection in a 3D window without obscuring contextual content while making the selection because the present invention allows the center of a magnified and/or selection area to be located relative to the geometry around the magnified and/or selection area.

Touchscreen computer systems may be automatically detected, in which case, an embodiment of the present invention adds a user interface (UI) button among the favorite buttons in a UI panel for touch interaction. Additionally, the present invention can automatically enable Touch Mode when tablet mode is enabled on a computer system.

The present invention overcomes drawbacks in state of the art systems by initiating one of multiple commands when a press of a finger or stylus is detected on the touchscreen display. Which of the multiple commands is initiated is determined by the duration that the finger or stylus is pressed on the display. Feedback is given to the user such that the user is aware of which of the multiple commands will be initiated. Hereinafter, embodiments described herein that refer to touch interactions with a finger will also encompass touch interactions with a stylus.

Figure 1A:
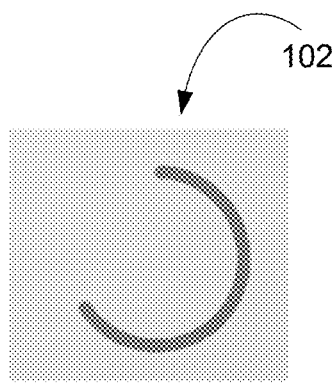
FIG. 1a, 1b, 1c are illustrations of progress rings in an embodiment of the present invention.
Figure 1B:
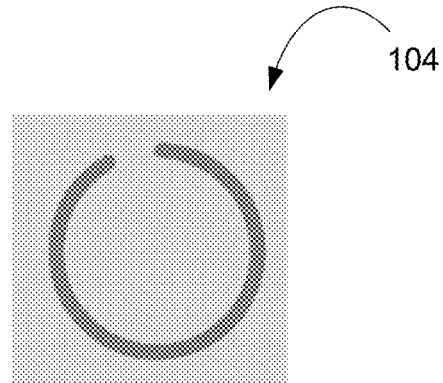
Figure 1C:
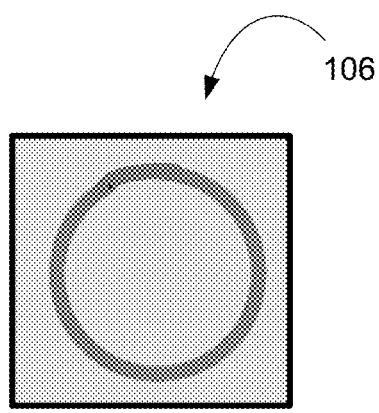

In an embodiment of the present invention, when a finger (or stylus) is placed on the touchscreen, a progress ring begins to grow around the finger (or stylus). Illustrated in FIGS. 1a and 1b are examples of progress rings. In FIG. 1a, a progress ring 102 that is approximately two-thirds of a circle is shown. In FIG. 1b, a nearly full circle progress ring 104 is shown. FIG. 1c illustrates a full progress ring 106. The growth of the progress ring 102/104 from approximately two-thirds of a circle to a nearly full circle visually informs the user what command will be initiated. If the user moves his or her finger prior to the full circle progress ring being formed, one command will be executed; otherwise another command will be executed. For example, if the present invention detects that the finger is being dragged within two seconds of the detection of the finger being placed on the screen, the present invention displays a gesture ring with standard and/or customized icons to select respective commands (illustrated in FIG. 2); whereas, after two seconds when the progress ring becomes a full circle, a user interface (UI) tool will appear (illustrated in FIGS. 3a, 3b, and 3c). Rather than two second intervals, other embodiments may implement other time intervals. Heuristic techniques may be used to determine the time interval most appropriate for an implementation.

The progress ring is a visual cue that informs the user how much time remains before a particular command is triggered. The fuller the progress ring's circle, the less time a user has to execute a first command and the less time the user needs to wait until a second different command is executed. Additionally, embodiments detect a tap on the touchscreen where the finger position does not change, in which case yet another command is executed; the visual feedback in this case is that the command is immediately executed.

Embodiments of the present invention report the progress using different means. In an embodiment, a series of lines or bars (rather than a circle) may be displayed as time progresses to indicate which command will be executed. The more lines or bars displayed indicate the amount of time that has elapsed. Another embodiment uses audio cues to indicate the amount of time that has elapsed, and therefore, which command will be executed depending on the next touch event (e.g., removal from the touchscreen or commencement of a dragging motion).

Figure 2:
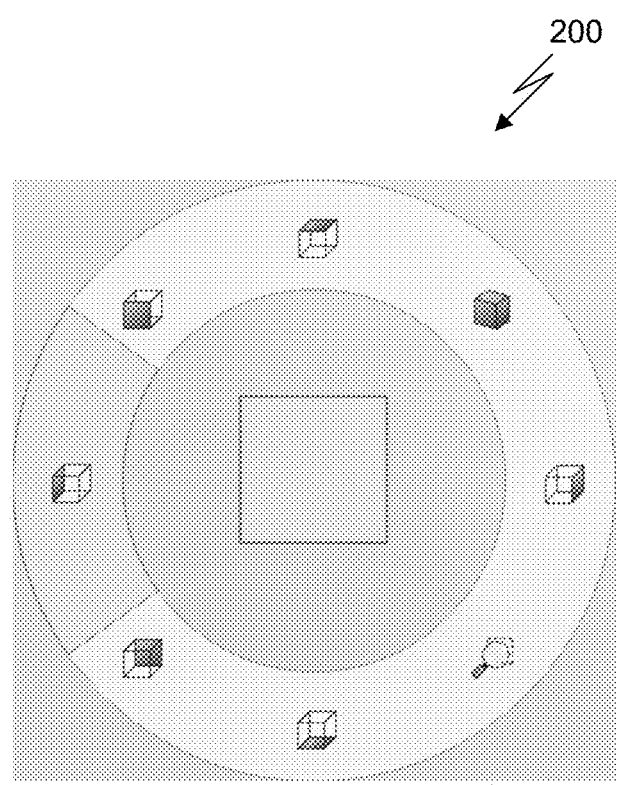
FIG. 2 is an illustration of a gesture ring in an embodiment of the present invention.

Referring now to FIG. 2, a gesture ring 200 with icons is shown. The gesture ring 200 is implemented in the SOLIDWORKS 2016 CAD application (a non-touch application), and enables a direction of a mouse gesture to select amongst several commands. In the SOLIDWORKS 2016 CAD application, the gesture ring 200 appears after a right mouse button event is detected. The present invention will allow for the gesture ring 200 to appear in a touch implementation based on the detection of a drag motion in less than a specific period of time (e.g., two seconds or less).

Figure 3A:
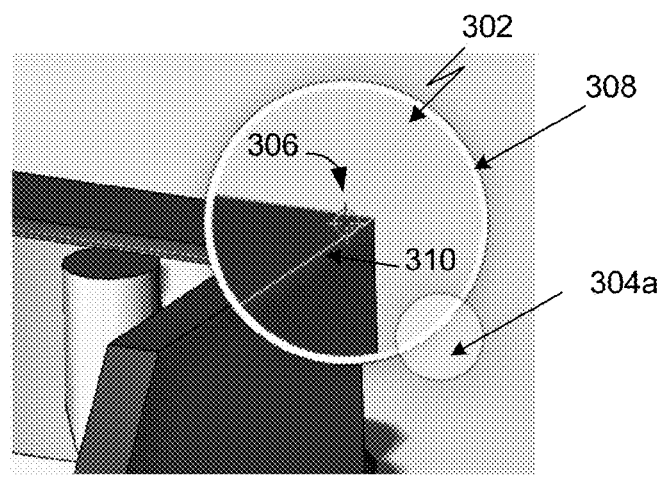
FIGS. 3a, 3b, and 3c are illustrations of a user interface tool in an embodiment of the present invention.

Referring now to FIG. 3a, a UI tool 302 is shown. The UI tool 302 resembles a bubble and can increase and decrease the size of an area enclosed by the UI tool. In an embodiment, if the finger holds steady for two seconds without producing a dragging motion, the progress ring will complete and thereby become a full circle after which the UI tool 302 will appear.

Additionally, the UI tool 302 may be initiated by other means than as one action of a multiple actions triggered by a single gesture. For example, a user may select a UI item from a menu or use voice activation to initiate the UI tool. Moreover, the UI tool may be initiated if the system detects that the user is having difficulty locating and/or selecting an object.

Determining whether a user is having difficulty selecting an entity may involve the detection of small, continuous touch motions without a selection being made. Detection is accomplished by computing the distance between the touch locations of consecutive dragging events. Embodiments may, for example, determine that a user is having difficulty selecting an entity using a stylus when each of five consecutive dragging events produce movement of less than 10 pixels on the touchscreen, when together five consecutive dragging events produce movement of 40 pixels on the touchscreen, when after three consecutive dragging events the stylus location has not strayed more than 5 pixels on the touchscreen from the stylus location produced by the first of the three consecutive dragging events, or any combination thereof. The number of consecutive dragging events and the number of pixels used in the calculation may be determined empirically or be user defined. The number of pixels in the foregoing example may differ if a finger rather than a stylus is used for touch selection.

Additionally, determining that a user is having difficulty making a selection may consider the speed of motion. A touch event may output a time value. The time lapse between such events can then be calculated and if many such events occur in a very short time period while a cursor remained within a small area on the touchscreen during these events, a determination that a user is having difficulty is made. Further indications that the user needs help trying to make a precision pick with accuracy include detecting that (a) the speed of the drag motion has decelerated and covers a small area in a longer period of time, and (b) the speed of the drag motion has decelerated then the drag motion stops and does not move for an interval of time (e.g., one or two seconds).

Importantly, the UI tool 302 is initially offset above and to the side of a finger touch area 304, unlike magnifier tools in prior art applications where the finger touch area is in the center of a magnified area and therefore obscures the objects beneath the touch area, or where the center of the magnified area is offset from the finger touch area but displays objects beneath the touch area making it difficult for a user to associate the magnified area with the target of the magnification. So as not to lose the visual context of the area enclosed by the UI tool 302, the present invention locates the center 306 of the enclosed area relative to the geometry outside the enclosed area. The present invention is distinct from a magnifier tool in prior art in that the center 306 in FIG. 3a and center 312 in FIG. 3b of the UI tool 302 perimeter ring 308 is the actual target of interest. The UI tool 302 may also change the magnification the enclosed area allowing for a clear view of the enclosed area inside the perimeter 308 of the UI tool 302 in context with the rest of the geometry without any occlusion from the physical finger or hand. The touch area 304 is on the perimeter 308 of the UI tool 302 and will maneuver the perimeter ring 308 as the finger is dragged on the touchscreen. Additionally, the touch area may or may not be visible. Visibility of the touch area may in some embodiments be set using an operating system variable. Embodiments may also position the perimeter ring 308 of the UI tool 302 close but not exactly coincident to the touch area 304.

Figure 3B:
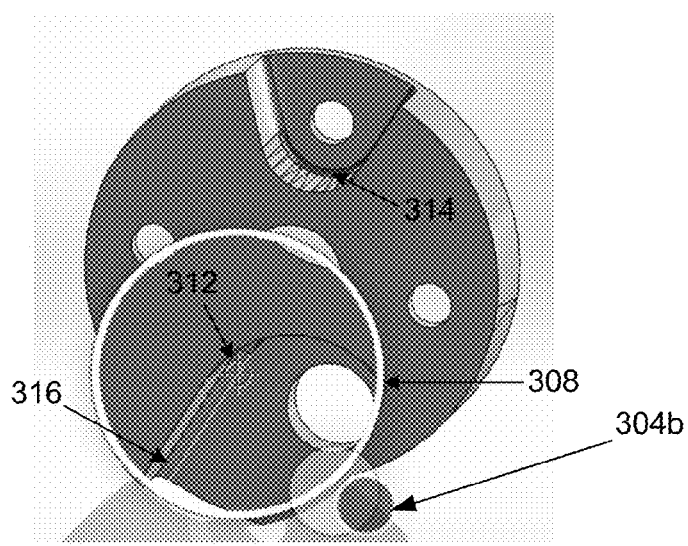
Figure 3C:
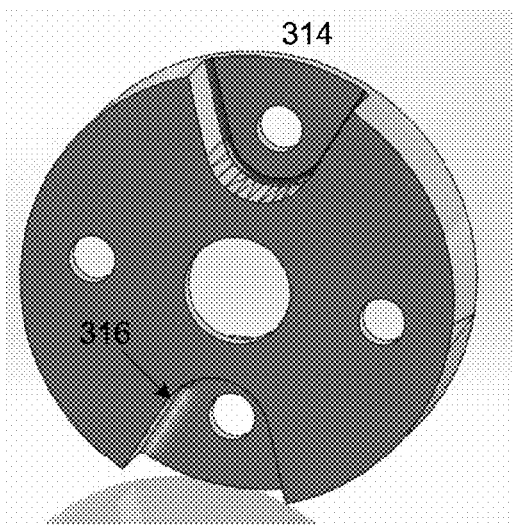

The enclosed area of perimeter 308 of the UI tool 302 not the touch area 304 determines which entities may be operated on by a UI tool function such as a selection, hover highlighting, or magnification function. FIGS. 3a, 3b, and 3c illustrate these functions. FIGS. 3a and 3b show magnified content within the perimeter ring 308. FIGS. 3a and 3b also show cursors (e.g., centers 306 and 312) hovering over an edge 310 and an edge 316 respectively, which are highlighted and selectable. FIGS. 3b and 3c illustrate edge 314 and edge 316 that have been selected and highlighted.

Although the UI tool 302 shown in FIGS. 3a, 3b, and 3c has the enclosed area created by perimeter ring 308, it will be understood by those skilled in the art that modifications may be made to the circular enclosure shape. An aim of the enclosed area is to enable a user to focus on entities in the enclosed area. For highlighting and selection operations, however, a horseshoe shape, a pointer, or a crosshair may serve the same purpose.

The finger touch area 304, shown as a transparent circular area on the perimeter 308 of the UI tool 302, is driven by a user's finger to reposition the UI tool 302. The user manipulates the UI tool 302 to target a selection without the finger touch area 304 obscuring the area of selection. Additionally, to better control the direction of motion of the UI tool 302, the user may slide his or her finger along the perimeter 308 giving an illusion of a rolling motion of the UI tool 302 and/or a repositioning of the finger touch area 304 to a different location on the perimeter of the UI tool 302. In embodiments of the present invention, the finger touch area 304 is initially displayed on the lower left rim of the UI tool 302 for left-handed users and the lower right rim of the UI tool 302 for right-handed users. Determination of whether a user is a left-handed or right-handed user may be determined by a system option setting in a computer system.

Furthermore, when the UI tool 302 is displayed two buttons are introduced in the touch user interface panel to dynamically change the zoom level inside the UI tool 302. These buttons—zoom in and zoom out—are displayed only when a UI magnifier tool is displayed on the computer touchscreen. When the UI magnifier tool is displayed on the touchscreen, a user may use the zoom in button to change the zoom scale from 1× to 2× or 2× to 3× or 3× to 4×, and so on, for example. The zoom out button changes the zoom level from 4× to 3×, or 3× to 2×, or 2× to 1×, and so on, for example.

As discussed the UI tool 302 may be used to highlight, select, and magnify one or more entities, for example, all the entities within perimeter ring 308. Additionally, the UI tool may be used to change the appearance inside the focus area (e.g., perimeter ring 308) to assist the user in viewing entities. Various display states may be localized in the focus area. For example, the entities inside a focus area may be presented in high contrast, in colorblind friendly palettes, and in ways to help the visually impaired; furthermore, color shading may be removed, a model may be shown as a wireframe model, a texture may be added and removed, and certain details of the model may be removed (e.g., entities that are smaller than a specified threshold value).

Figure 4:
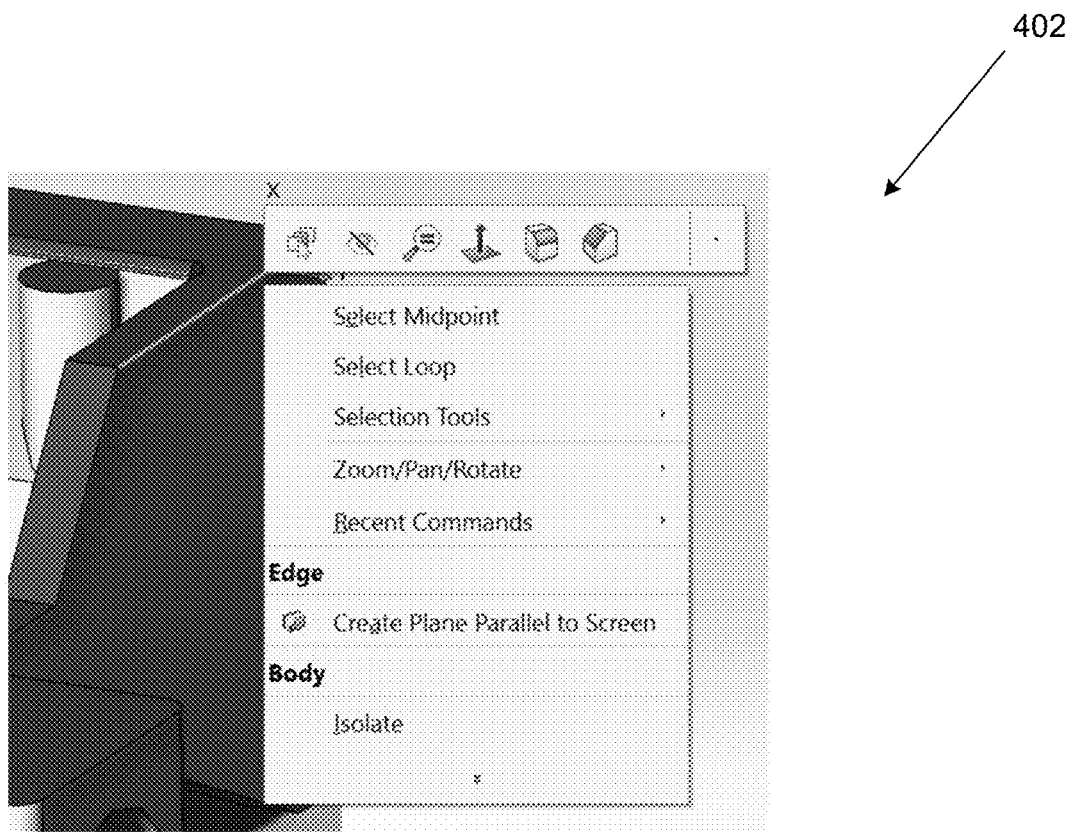
FIG. 4 is an illustration of a contextual menu in an embodiment of the present invention.

As discussed, after pressing a finger on the touchscreen and detecting a dragging motion one of two commands may be executed depending on the amount of time that has elapsed before a dragging motion was detected. Additionally, a third command may be executed after pressing a finger on the touchscreen. The third command is executed if the finger is removed from the touchscreen at any time without being dragged. This third command may display a contextual menu appropriate to the item under the finger touch area (e.g., contextual menu 402 illustrated in FIG. 4). For computer systems with mouse devices, this occurs in many cases by pressing and releasing the right mouse button.

Figure 5:
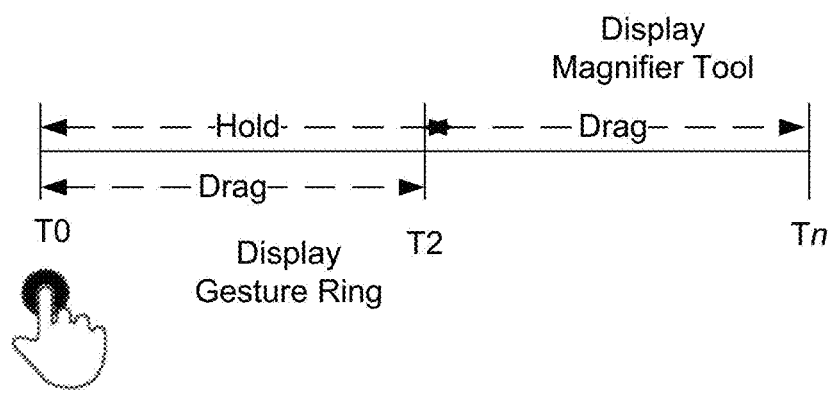
FIG. 5 is a schematic of the triggering of commands in an embodiment of the present invention.

Referring now to FIG. 5, the breakoff points that trigger a number of commands are illustrated. At T0, the present invention detects a finger down event. If the finger down event is not immediately followed by a finger up event (meaning the user has tapped the touchscreen), the visual progress ring is displayed to indicate the amount of time elapsing (as has been discussed). If the finger remains in the same location until the visual progress ring completes at T2 (e.g., for more than two seconds), and then a drag motion is detected, one command is activated, such as the previously discussed UI tool command. If the drag motion is detected prior to the completion of the visual progress ring (e.g., for two seconds or less), then another command is executed, such as a command that displays the gesture ring. If at any time the user lifts his or her finger off the computer screen without the location of the finger changing, then yet another command may be executed such as a command that displays and activates a contextual menu.

An advantage of the present invention includes mapping commonly used mouse events to gestures used for a touch device, which does not have a multi-button mouse or keyboard to activate commands; another advantage is including visual and/or audio feedback to indicate which of several commands will be executed.

Other advantages include improving the usefulness of a UI tool by initially offsetting the touch area that controls the motion of the UI tool so not to obscure objects beneath the touch area or beneath one's hand, the location of the offset depending on whether a user is left- or right handed.

Figure 6A:
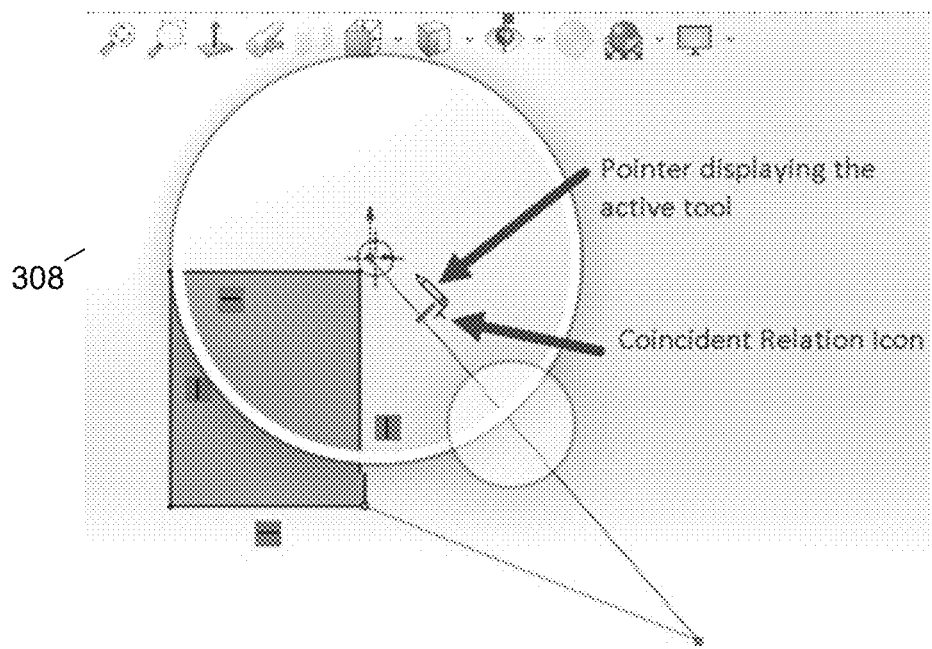
FIGS. 6a and 6b illustrate feedback tools in an embodiment of the present invention.
Figure 6B:
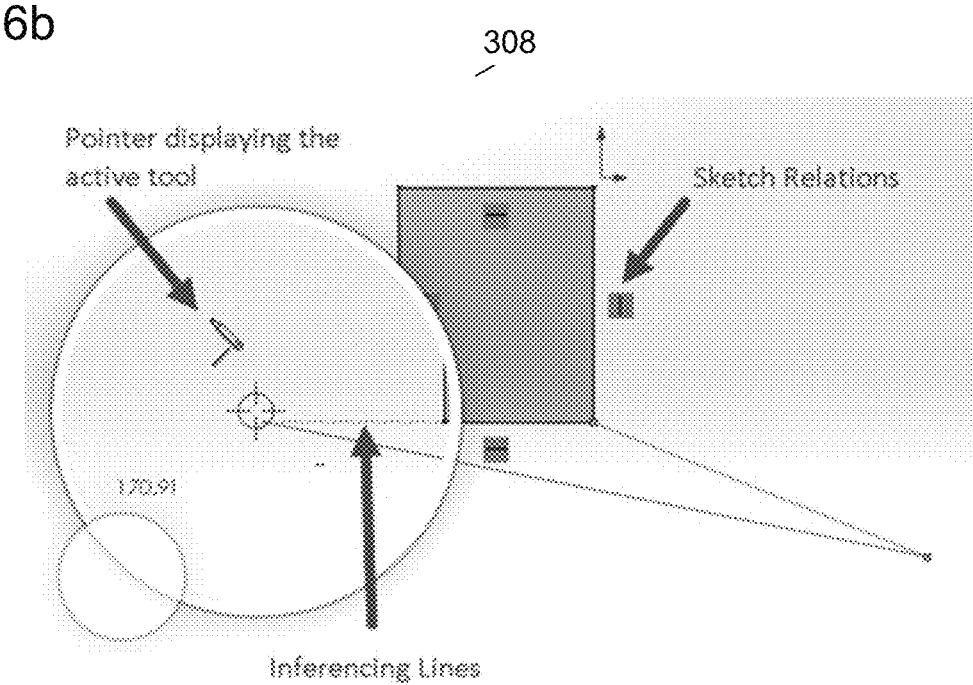

Referring to FIGS. 6a and 6b illustrate further examples of objects not obscured by using the present invention. FIGS. 6a and 6b show a zoomed in right-handed and zoomed out left-handed UI tools, respectively. Inside the perimeter ring 308 are objects that provide valuable feedback to a user. A pointer 602 provides feedback to the user with respect to the active tool. An icon 604 informs the user of a coincident relationship. Additionally, inferencing lines 606 provide feedback to the user. Without an implementation of the present invention feedback objects 602, 604, and 606 would be obscured by a user's finger and/or hand.

Yet other advantages of the present invention are that in addition to magnifying an object, the UI tool may be used for selecting an object and highlighting an object as shown in FIGS. 3a, 3b, and 3c.

Computer Support

Figure 7:
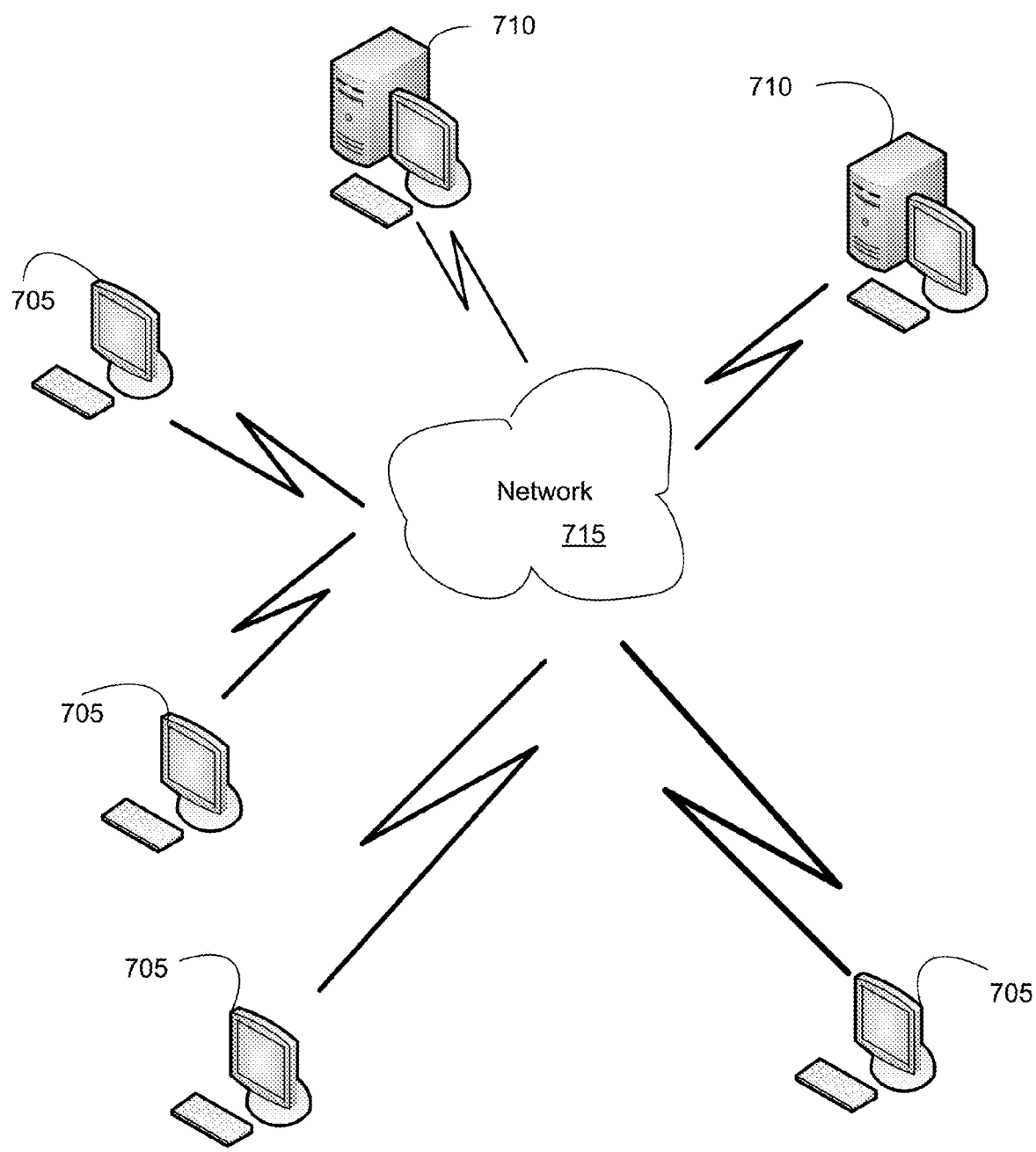
FIG. 7 is a schematic diagram of a computer system network embodying the present invention.

FIG. 7 illustrates a computer network or similar digital processing environment in which the present invention may be implemented.

Client computer(s)/device(s) 705 and server computer(s) 710 provide processing, storage, and input/output, and execute application programs and the like. Client computer(s)/device(s) 705 can also be linked through communications network 715 to other computing devices, including other client computer(s)/device(s) 705 and server computer(s) 710. Communications network 715 can be part of a remote access network, a global network (e.g., the Internet), a worldwide collection of computers, local area or wide area networks, gateways, and cloud computing that currently use respective protocols (TCP/IP, Bluetooth, etc.) to communicate with one another. Other electronic computer/device network architectures are suitable.

Figure 8:
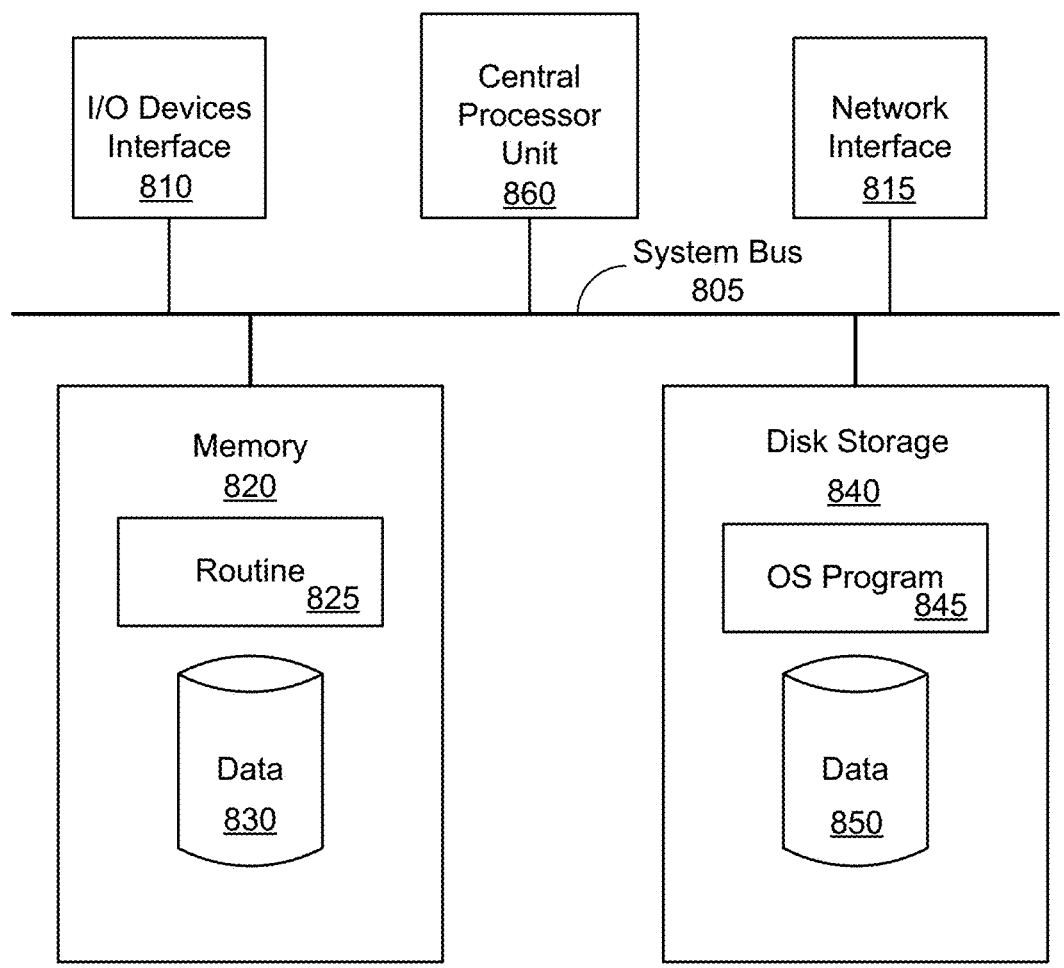
FIG. 8 is a block diagram of a computer system embodying the present invention.

FIG. 8 is a diagram of the internal structure of a computer (e.g., client computer/device 705 or a server computer 710) in the computer network of FIG. 7. Each computer 705, 710 contains system bus 805, where a bus is a set of hardware lines used for data transfer among the components of a computer or processing system. System bus 805 is essentially a shared conduit that connects different elements of a computer system (e.g., processor, disk storage, memory, input/output ports, network ports, etc.) and enables the transfer of information between the elements. Attached to system bus 805 is I/O device interface 810 for connecting various input and output devices (e.g., keyboard, mouse, stylus, touch input, displays, printers, speakers) to the computer 705, 710. Network interface 815 allows the computer to connect to various other computer(s)/device(s) attached to a network (e.g., network 715 of FIG. 7). Memory 820 provides volatile storage for computer software instructions 825 and data 830 used to implement an embodiment, such as the system of the present invention (e.g., progress ring 102/104/106, UI tool 302, and supporting software code and data structures described herein). Disk storage 840 provides non-volatile storage for computer software instructions 825 and data 830 used to implement an embodiment of the present invention. Central processor unit 860 is also attached to system bus 805 and provides for the execution of computer instructions.

In one embodiment, the software instructions 825 and data 830 are generated by a computer program product. The computer program product may include a computer readable medium such as a removable storage medium (e.g., one or more DVD-ROM's, CD-ROM's, diskettes, tapes), a memory medium, and the like. The computer program product provides at least a portion of the software instructions for the present invention. The computer program product can be installed by any suitable software installation procedure, as is well known in the art. In another embodiment, at least a portion of the software instructions may also be downloaded over a cable, communication, and/or wireless connection. In other embodiments, the software 825 and data 830 are a computer program propagated signal product embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 825.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of the computer program product is a propagation medium that the computer/device 705, 710 may receive and read, such as by receiving the propagation medium and identifying a propagated signal embodied in the propagation medium, as described above for computer program propagated signal product.

What is claimed is:

1. A computer-implemented method for implementing a user interface (UI) tool for a touchscreen computer device, the method comprising:

displaying a CAD model of a physical object on a display of the touchscreen computer device, the display of the touchscreen computer device having a surface;

actively monitoring three-dimensional geometry of the CAD model, said monitoring being in an ongoing manner;

detecting an object touching the surface of the display;

in response to detecting the object touching the surface, (a) automatically enabling a touch mode of the touchscreen computer device, the touch mode modifying a non-touch interface that replicates a functionality of the non-touch interface; and (b) identifying, based on the actively monitored three-dimensional geometry, a local geometry of the CAD model surrounding a position of the object touching the surface;

determining, based on (a) the identified local geometry and (b) the position of the object touching the surface of the display, an area of interest: (i) offset from the position of the object touching the surface, and (ii) unobscured by the position of the object touching the surface;

displaying a touch compatible version of a UI tool; of the non-touch interface, having a perimeter that (i) intersects the position of the object touching the surface, and (ii) encloses the area of interest, wherein the displayed UI tool has a UI center position located at a target of interest within the area of interest, the target of interest determined based on the three-dimensional geometry of portions of the CAD model outside the enclosed area of interest;

controlling by a user the displayed UI tool using the object; and responsive to the user controlling the displayed UI tool, executing by the touchscreen computer device a command, the command operating on the CAD model remote from and not underneath the position of the object touching the surface.

2. The computer-implemented method of claim 1, further comprising invoking the UI tool detecting user difficulty with selection of the displayed entity.

3. The computer-implemented method of claim 1, wherein the enclosed area enables a user to focus on a subset of the one or more entities displayed on the touchscreen computer device.

4. The computer-implemented method of claim 3, wherein:
the command modifies a display state within the area to change an appearance of the subset of entities.

5. The computer-implemented method of claim 3, wherein:
the area surrounds the subset of displayed entities; and
the UI tool magnifies the subset of displayed entities.

6. The computer-implemented method of claim 3, further comprising highlighting at least one entity of the subset of entities when a target of the UI tool hovers over the at least one entity of the subset.

7. The computer-implemented method of claim 1, wherein:
for left-handed users, the initial offset of the UI center position is to the right of the touch object; and
for righted-handed users, the initial offset of the UI center position is to the left of the touch object.

8. A non-transitory computer-readable data storage medium comprising instructions causing a computer to:
display a CAD model of a physical object on a display of a touchscreen computer system, the display of the touchscreen computer system having a surface;
actively monitor three-dimensional geometry of the CAD model, said monitoring being in an ongoing manner;
detect an object touching the surface of the display;
in response to detecting the object touching the surface, (a) automatically enable a touch mode of the touchscreen computer device, the touch mode modifying a non-touch interface that replicates a functionality of the non-touch interface; and (b) identifying, based on the actively monitored three-dimensional geometry, a local geometry of the CAD model surrounding a position of the object touching the surface;
determine, based on (a) the identified local geometry and (b) the position of the object touching the surface of the display, an area of interest: (i) offset from the position of the object touching the surface, and (ii) unobscured by the position of the object touching the surface;
display a touch compatible version of a user interface tool of the non-touch interface having a perimeter that (i) intersects the position of the object touching the surface, and (ii) encloses the area of interest, wherein the displayed interface tool has a UI center position located at a target of interest within the area of interest, the target of interest determined based on the three-dimensional geometry of portions of the CAD model outside the enclosed area of interest;
manipulate the displayed user interface tool from the position of the touching object; and
responsively perform an operation on the CAD model remote from and not underneath the position of the object touching the surface.

9. The computer-readable data storage medium of claim 8, wherein:
the user interface tool is used to enclose in the area a subset of the one or more entities displayed on the touchscreen computer system; and
the user interface tool is used to magnify the subset of the one or more displayed entities.

10. The computer-readable data storage medium of claim 9, further comprising instructions causing a computer to highlight an entity of the enclosed subset of entities when a target of the user interface tool hovers over the entity of the enclosed subset of entities.

11. The computer-readable data storage medium of claim 8, further comprising instructions causing a computer to:
for left-handed users, offset the UI center position to the right of the position of the object touching the display surface; and
for righted-handed users, offset the UI center position to the left of the position of the object touching the display surface.

12. The computer-readable data storage medium of claim 8, further comprising instructions causing a computer to display the user interface tool after determining a user having difficulty locating an entity.

13. The computer-readable data storage medium of claim 8, further comprising instructions causing a computer to move the touching object along the perimeter of the user interface tool causing a real or an illusory change of direction of motion of the user interface tool.

14. The computer-readable data storage medium of claim 8, wherein:
the user interface tool is displayed upon determining a command to execute;
the command is one of a plurality of commands; and wherein determining the command to execute is the result of timing a duration prior to the touching object commencing a dragging motion.

15. A computer system comprising:
a processor operatively coupled to a data storage system, the data storage system storing a three-dimensional model; and
a data storage memory operatively coupled to the processor and comprising instructions to configure the processor to:
display a CAD model of a physical object on a display of a touchscreen computer system, the display having a surface;
actively monitor three-dimensional geometry of the CAD model said monitoring being in an ongoing manner;

detect an object touching the surface of the display;
in response to detecting the object touching the surface, (a) automatically enable a touch mode of the touchscreen computer device, the touch mode modifying a non-touch interface that replicates a functionality of the non-touch interface; and (b) identifying, based on the actively monitored three-dimensional geometry, a local geometry of the CAD model surrounding a position of the object touching the surface;
determine, based on (a) the identified local geometry and (b) the position of the object touching the surface of the display, an area of interest: (i) offset the position of the object touching the surface, and (ii) unobscured by the position of the object touching the surface;
display a touch compatible version of a user interface tool; of the non-touch interface, having a perimeter that (i) intersects the position of the object touching the surface, and (ii) encloses the area of interest, wherein the displayed interface tool has a UI center position located at a target of interest within the area of interest, the target of interest determined based on three-dimensional geometry of a portion of the CAD model outside the enclosed area of interest;
manipulate the displayed user interface tool from the position of the touching object; and
responsive to the manipulating of the displayed user interface tool, perform an operation on the CAD model remote from and not underneath the position of the object touching the surface.

16. The computer system of claim 15, wherein:
the user interface tool focuses on the enclosed area on the touchscreen computer system; and
the operation modifies an appearance of a subject entity within the enclosed area.

17. The computer system of claim 15, wherein:
the user interface tool is used to enclose in the area a subset of the one or more entities displayed on the touchscreen computer system; and
the user interface tool is used to magnify the subset of the one or more displayed entities.

18. The computer system of claim 17, wherein the data storage memory further comprises instructions to configure the processor to highlight an entity of the enclosed subset of entities when a target of the user interface tool hovers over the entity of the enclosed subset of entities.

19. The computer system of claim 15, further comprising instructions to configure the processor to:
for left-handed users, offset the UI center position to the right of the position of the object touching the display surface; and
for righted-handed users, offset the UI center position to the left of the position of the object touching the display surface.

20. The computer system of claim 15, further comprising instructions to configure the processor to invoke the user interface tool after detecting user difficulty with selection of an entity.

* * * * *